United States Patent
Endo et al.

(10) Patent No.: US 9,570,506 B2
(45) Date of Patent: Feb. 14, 2017

(54) PHOTOELECTRIC CONVERSION DEVICE AND MANUFACTURING METHOD OF THE SAME

(71) Applicant: CANON KABUSHIKI KAISHA, Tokyo (JP)

(72) Inventors: Nobuyuki Endo, Fujisawa (JP); Katsunori Hirota, Yamato (JP); Takumi Ogino, Koganei (JP); Masashi Kusukawa, Sagamihara (JP); Seiichi Tamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/700,391

(22) Filed: Apr. 30, 2015

(65) Prior Publication Data

US 2015/0333098 A1 Nov. 19, 2015

(30) Foreign Application Priority Data

May 14, 2014 (JP) ................... 2014-100785

(51) Int. Cl.
*H01L 27/146* (2006.01)
*H01L 31/02* (2006.01)
*H01L 31/0264* (2006.01)

(52) U.S. Cl.
CPC ..... *H01L 27/14689* (2013.01); *H01L 27/1463* (2013.01); *H01L 27/14609* (2013.01);
(Continued)

(58) Field of Classification Search
CPC ................ H01L 27/14689; H01L 27/14643;
H01L 27/1463; H01L 21/26513; H01L 29/78615
See application file for complete search history.

(56) References Cited

U.S. PATENT DOCUMENTS 4,587,713 A * 5/1986 Goodman ........... H01L 29/1095
257/335
6,111,281 A 8/2000 Isogai
(Continued)

FOREIGN PATENT DOCUMENTS

| JP | 09-260628 A | 10/1997 |
|----|----|----|
| JP | 2006-073607 A | 3/2006 |

(Continued)

*Primary Examiner* — Dale E Page
*Assistant Examiner* — Vincent Wall
(74) *Attorney, Agent, or Firm* — Fitzpatrick, Cella, Harper & Scinto (57) ABSTRACT

A photoelectric conversion device includes a pixel circuit section including: a first semiconductor region containing a first conductivity type impurity; a second semiconductor region formed in the first semiconductor region by using the first conductivity type impurity; a third semiconductor region formed in the second semiconductor region by using a second conductivity type impurity; and a contact plug formed on the third semiconductor region. A net concentration of the first conductivity type impurity is higher in the second semiconductor region than in the first and third semiconductor regions. In the second and third semiconductor regions, a distance between the contact plug and a position where the concentration of the second conductivity type impurity is maximum is equal to or less than a distance between the contact plug and a position where the concentration of the first conductivity type impurity is maximum.

20 Claims, 10 Drawing Sheets

(52) U.S. Cl.
CPC .. *H01L 27/14616* (2013.01); *H01L 27/14636* (2013.01); *H01L 27/14643* (2013.01); *H01L 31/02* (2013.01); *H01L 31/02005* (2013.01); *H01L 31/0264* (2013.01); *H01L 27/1462* (2013.01)

(56) References Cited

U.S. PATENT DOCUMENTS

| | | | |
|---|---|---|---|
| 7,205,523 B2 | 4/2007 | Mishima et al. | |
| 7,365,380 B2 | 4/2008 | Yuzurihara et al. | |
| 7,592,579 B2 | 9/2009 | Tamura et al. | |
| 7,749,796 B2 | 7/2010 | Wakano et al. | |
| 7,763,888 B2 | 7/2010 | Wakano et al. | |
| 7,993,951 B2* | 8/2011 | Okabe | H01L 21/28518 257/E31.052 |
| 7,994,552 B2 | 8/2011 | Yuzurihara et al. | |
| 8,184,189 B2 | 5/2012 | Tamura | |
| 8,293,559 B2 | 10/2012 | Okabe et al. | |
| 8,309,997 B2 | 11/2012 | Yuzurihara et al. | |
| 2006/0043436 A1* | 3/2006 | Fan | H01L 27/14636 257/290 |
| 2008/0142849 A1* | 6/2008 | Alvarez | H01L 21/26513 257/213 |
| 2013/0181309 A1 | 7/2013 | Johnson et al. | |
| 2014/0346578 A1 | 11/2014 | Hirota | |
| 2014/0374863 A1 | 12/2014 | Ogino | |
| 2015/0097238 A1* | 4/2015 | Zhang | H01L 29/6659 257/347 |
| 2015/0147843 A1* | 5/2015 | Onuki | H01L 27/14643 438/59 |
| 2015/0155173 A1* | 6/2015 | Hirota | H01L 21/283 438/682 |
| 2015/0177843 A1* | 6/2015 | Kwon | G06F 3/012 715/863 |
| 2015/0214269 A1* | 7/2015 | Endo | H01L 27/14685 257/443 |
| 2015/0287820 A1* | 10/2015 | Mallikarjunaswamy | H01L 29/456 257/341 |

FOREIGN PATENT DOCUMENTS

| | | |
|---|---|---|
| JP | 2006-269546 A | 10/2006 |
| JP | 2007-207891 A | 8/2007 |
| JP | 2011-029604 A | 2/2011 |
| JP | 2013-149740 A | 8/2013 |
| JP | 2014-099626 A | 5/2014 |

* cited by examiner

Prior Art

PHOTOELECTRIC CONVERSION DEVICE AND MANUFACTURING METHOD OF THE SAME

BACKGROUND OF THE INVENTION

Field of the Invention

The present invention relates to a photoelectric conversion device and a manufacturing method thereof.

Description of the Related Art

As imaging apparatuses chiefly used in digital still cameras and video camcorders, demand for photoelectric conversion devices has been increased. Among photoelectric conversion devices used in digital still cameras, in particular those having a large size, such as APS-C size to 35 mm film size, have recently been widely used. As the above photoelectric conversion devices, CCD-type or MOS-type photoelectric conversion devices are used. Such a photoelectric conversion device includes a number of pixels arranged in an array across a large region, and a well contact is provided in every pixel in order to stabilize a reference potential at a center portion of a pixel circuit section and in a peripheral circuit section.

A method of forming a well contact for supplying a reference potential to a common well among pixels is disclosed in Japanese Patent Laid-Open No. 2006-73607. In the method disclosed in Japanese Patent Laid-Open No. 2006-73607, the common well among the pixels is formed as a p-type impurity region, and a p-type impurity region having a higher p-type impurity concentration than that of the common well is further formed in the well contact in every pixel prior to formation of a contact interlayer film. P-type impurity having a high concentration is further ion-implanted into an opening of a contact hole after the contact hole is opened, thereby forming the well contact having a higher concentration of the p-type impurity than that of a p-type impurity introducing region.

In the case of forming the well contact in this manner, contact etching and ion-implantation may induce crystal defects, or may cause contamination with impurity atoms of heavy metals, or the like. Crystal defects and contamination with impurity atoms of heavy metals in a well contact region may cause deterioration of sensor characteristics, particularly deterioration of noise characteristics, such as occurrence of white defects and dark currents.

Although not mentioned in Japanese Patent Laid-Open No. 2006-73607, it is necessary to supply a stable potential for contact holes to n-type impurity regions of a pixel circuit section, such as a source region, a drain region, a gate region, and a floating diffusion region. Therefore, after opening each contact hole in the pixel circuit section, n-type impurity having a higher concentration than that of p-type impurity should be ion-implanted into the opening of each contact hole. In this case, the n-type impurity is also ion-implanted in a well contact region to be a p-type impurity region, which causes change in effective p-type impurity concentration (a net p-type impurity concentration) distributions, so that it is concerned that white defects may occur, and dark current characteristics may become deteriorated. Hence, it is essential to control an impurity profile including not only concentration distributions of p-type impurity formed before the contact hole is formed, but also concentration distributions of n-type impurity to be ion-implanted, thereby controlling distributions of effective p-type impurity concentration.

SUMMARY OF THE INVENTION

The present invention provides a photoelectric conversion device excellent in sensor characteristics.

The present invention in its one aspect provides a photoelectric conversion device comprising a pixel circuit section and a peripheral circuit section, the pixel circuit section comprising: a first semiconductor region containing a first conductivity type impurity; a second semiconductor region formed in the first semiconductor region by using the first conductivity type impurity; a third semiconductor region formed in the second semiconductor region by using a second conductivity type impurity; and a contact plug formed on the third semiconductor region, wherein a net concentration of the first conductivity type impurity that is obtained by subtracting a concentration of the second conductivity type impurity from a concentration of the first conductivity type impurity is higher in the second semiconductor region than in the first semiconductor region and the second semiconductor region, and in the second semiconductor region and the third semiconductor region, a distance between the contact plug and a position where the concentration of the second conductivity type impurity is maximum is equal to or less than a distance between the contact plug and a position where the concentration of the first conductivity type impurity is maximum.

Further features of the present invention will become apparent from the following description of exemplary embodiments with reference to the attached drawings.

DESCRIPTION OF THE EMBODIMENTS

Figure 1A:
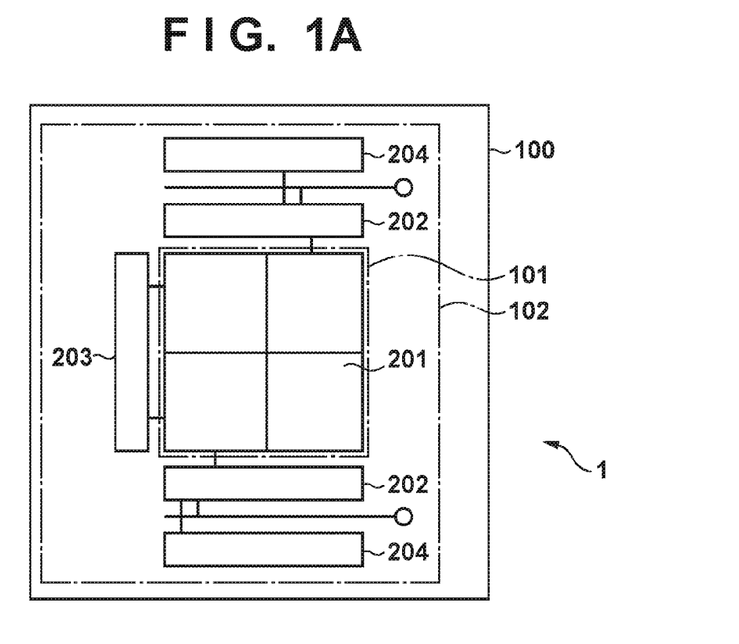
FIGS. 1A and 1B are schematic plane views showing an example of a photoelectric conversion device according to the present invention.
Figure 1B:
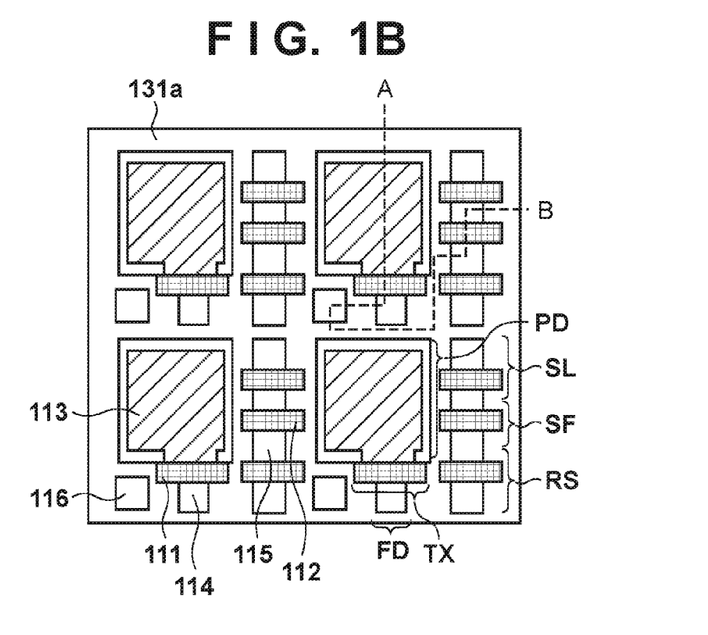

An embodiment of the present invention will be described as below. FIGS. 1A and 1B show an example of an arrangement plane view of a photoelectric conversion device. Hereinafter, the embodiment of the present invention will be described in detail using examples with reference to accompanying drawings. The present invention is not limited to the present embodiment, and change or combination thereof may be made without departing from the scope of the invention. In the following description and drawings, same reference numerals are given to the same elements as those among plural drawings. Therefore, the same elements are described by mutually referring to the plural drawings, and overlapping description thereof will be appropriately omitted. The photoelectric conversion device 1 includes a pixel circuit section 101 in which pixel circuits 201 are arranged, and a peripheral circuit section 102 in which peripheral circuits (202 to 204) are arranged. The pixel circuit section 101 and the peripheral circuit section 102 are disposed on a single semiconductor substrate 100.

FIG. 1B shows an example of an arrangement plane view pertinent to four pixel circuits 201 of the pixel circuit section 101. Each pixel circuit 201 constitutes a single unit including a photoelectric conversion element PD and a readout circuit for reading out signals from the photoelectric conversion element PD. A region where these plural pixel circuits 201 are arranged is the pixel circuit section 101. A pixel is a minimum unit of an assembly of the photoelectric conversion element PD such as a photodiode and elements used for reading out imaging signals from this photoelectric conversion element PD to an output line. Each pixel circuit 201 includes an amplification element SF for generating a signal based on the amount of electric charge generated in the photoelectric conversion element PD. The photoelectric conversion device 1 having the above structure may constitute a pixel-amplification type imaging apparatus. The above element assembly includes a transfer element TX, a capacitive element FD, an amplification element SF, and a reset element RS, for example. In this example, a selective element SL is also included in the element assembly. These elements may be shared with an adjacent photoelectric conversion element PD; and in this case, a pixel may be defined by a minimum unit of an element assembly for reading out signals from the photoelectric conversion element PD. In order to realize focus detection with a phase-difference detection method, a single pixel is provide with plural photoelectric conversion elements PD, and signals from the pixel of interest may be handled as a sum of signals from the plural photoelectric conversion elements PD.

As shown in FIG. 1A, the peripheral circuit section 102 includes signal processing circuits 202, a vertical shift register 203, and horizontal shift registers 204. The signal processing circuit 202 is a circuit for amplifying signals and removing noises of pixels read out from the pixel circuits 201 by CDS processing. The signal processing circuit 202 may also be a circuit for converting plural signals that are read out line by line in parallel from two-dimensionally arranged pixels into serial signals so as to be externally output. The vertical shift register 203 is a driving circuit for selecting the pixel circuits 201 arranged in the pixel circuit section 101 row by row, and driving these circuits. The horizontal shift register 204 is a circuit for driving the signal processing circuits 202 to transfer signals from the signal processing circuits 202 to the outside. In the case of performing AD-conversion in the photoelectric conversion device 1, an AD conversion circuit may be included in the peripheral circuit.

Figure 2:
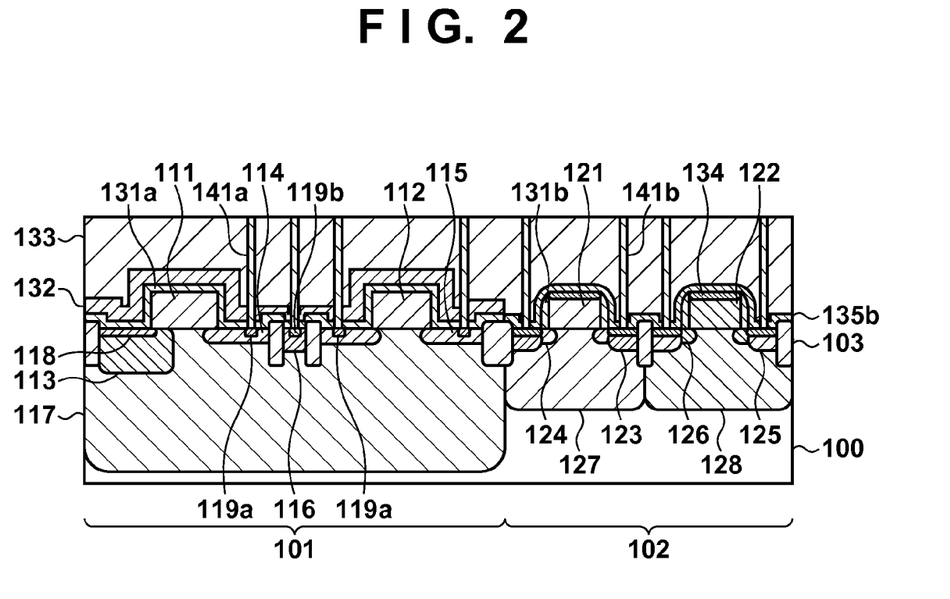
FIG. 2 is a schematic cross sectional view showing an example of the photoelectric conversion device according to the present invention.

The photoelectric conversion device 1 according to the present invention will be described with reference to FIG. 2. FIG. 2 is a schematic cross sectional view of the photoelectric conversion device 1, taken along line A-B in FIG. 1B. In the present embodiment, a reset MOS transistor is exemplified as a MOS transistor (a first MOS transistor) disposed in the pixel circuit section 101. FIG. 2 shows a cross sectional structure of a photoelectric conversion element, a transfer MOS transistor, a pixel MOS transistor of the pixel circuit section 101. In this case, a reset MOS transistor is shown as an example of the pixel MOS transistor, but may be a source follower MOS transistor, or a select MOS transistor instead. The MOS transistor (a second MOS transistor) indicated in the peripheral circuit section 102 constitutes any one of the aforementioned circuits.

In the pixel circuit section 101, each active region is isolated by an element isolation region 103 formed on the semiconductor substrate 100 of silicon or the like by shallow trench isolation (STI) or local oxidation of silicon (LOCOS). A gate electrode 111 of the transfer MOS transistor, and a gate electrode 112 of the reset MOS transistor are formed in the pixel circuit section 101. A second conductivity type impurity region 113 constitutes the photoelectric conversion element. The second conductivity type is the same as a conductivity type of photoelectric charge (signal charge) that is treated as a signal by the photoelectric conversion element, and becomes an n-type in the case of using electrons as signal charge. Between the surface of the semiconductor substrate 100 and the second conductivity type impurity region 113, a first conductivity type (p-type) impurity region 118 is so formed as to form the photoelectric conversion element into an embedding structure. A second conductivity type impurity region 114 forms a floating diffusion (FD). A second conductivity type impurity region 115 is supplied with a reference voltage for resetting or pixel selection so as to function as a drain of the reset MOS transistor.

An antireflection film 131a is a film including a silicon nitride layer, for example, and reduces reflection on the surface of the photoelectric conversion element. The antireflection film 131a may be a laminated film of a silicon oxide layer or a silicon nitride layer. A protective film 132 is an insulation film, such as a silicon oxide film, for covering the pixel circuit section 101, and functioning for protecting the pixel circuit section 101 from metal pollution when metallic compounds, such as cobalt silicide, are used to form an electrode in the peripheral circuit section 102. An electrical conductor 141a is a contact plug or the like. The antireflection film 131a and the protective film 132 are not limited to a combination of the silicon nitride layer and the silicon oxide layer. The silicon nitride layer functioning as the antireflection film 131a may be formed by low-pressure CVD. The silicon nitride layer included in an insulation film 135b functioning as a contact etching stopper of the peripheral circuit section 102 may be formed by plasma enhanced CVD.

A source of the transfer MOS transistor is shared with the impurity region 113 constituting the photoelectric conversion element. A drain of the transfer MOS transistor, a drain of the reset MOS transistor, and an FD are formed by a common semiconductor region. The impurity region 114 functioning as a floating diffusion region (FD) is connected to a gate electrode of an amplifying MOS transistor via an electrode (not shown), and the impurity region 115 is connected to a reference voltage wiring for resetting (not shown) via an electrode.

Figure 5A:
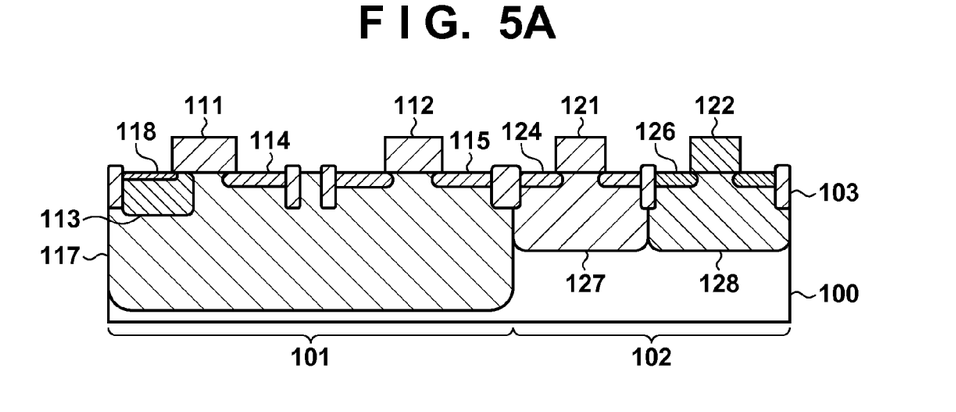
FIGS. 5A to 5P are schematic cross sectional views of a process flow showing an example of a producing method of the photoelectric conversion device according to the present invention.

A well contact region (a second semiconductor region) according to the present invention will be described as bellow. The well contact region 116 is a region for specifying a potential of a well (a first semiconductor region) 117; and the well contact region 116 becomes a p-type semiconductor region if the impurity region 113 of the photoelectric conversion element is an n-type semiconductor region and electric charge treated as a signal is electrons. At the same time, it is necessary to supply a stable potential for an n-type semiconductor region of the second conductivity type, such as a source, a drain, an FD, and a gate electrode in a photoelectric conversion region. Hence, the n-type impurity of the second conductivity type is implanted in a surface region 119a after a contact hole 142a, which is shown in FIG. 5K, of the pixel circuit section 101 is opened. This implantation is performed to all the contact holes 142a, which are filled with an electrical conductor to form the electrode (contact plug) 141a, across the entire surface of the pixel circuit section 101; thus the n-type impurity is also implanted into the well contact hole (a third semiconductor region) 119b of a p-type semiconductor region.

Figure 3A:
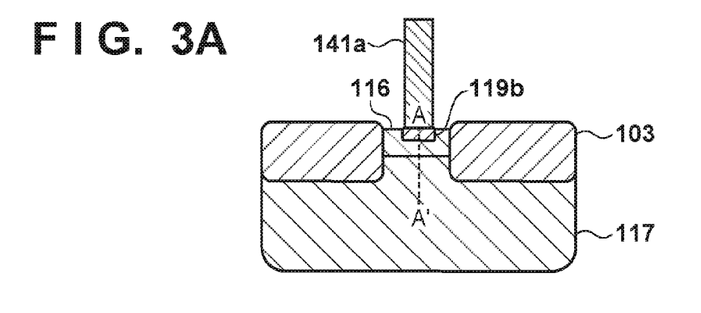
FIGS. 3A to 3C are drawings showing impurity distributions in a depth direction of a well contact region.
Figure 3B:
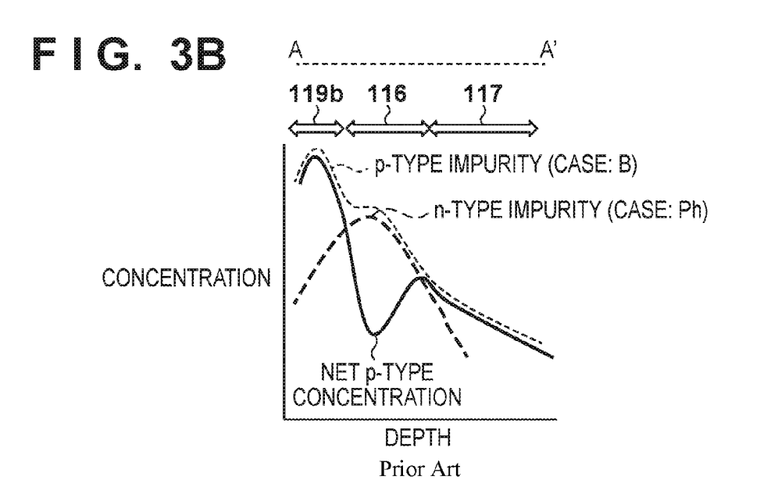
Figure 3C:
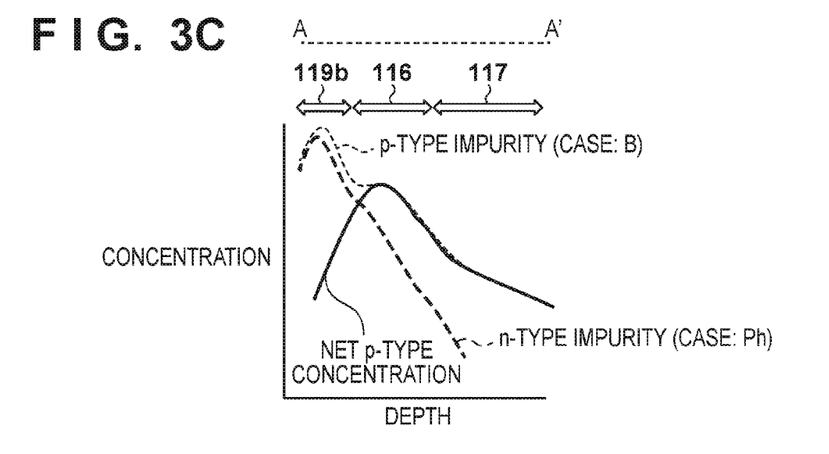
Figure 4:
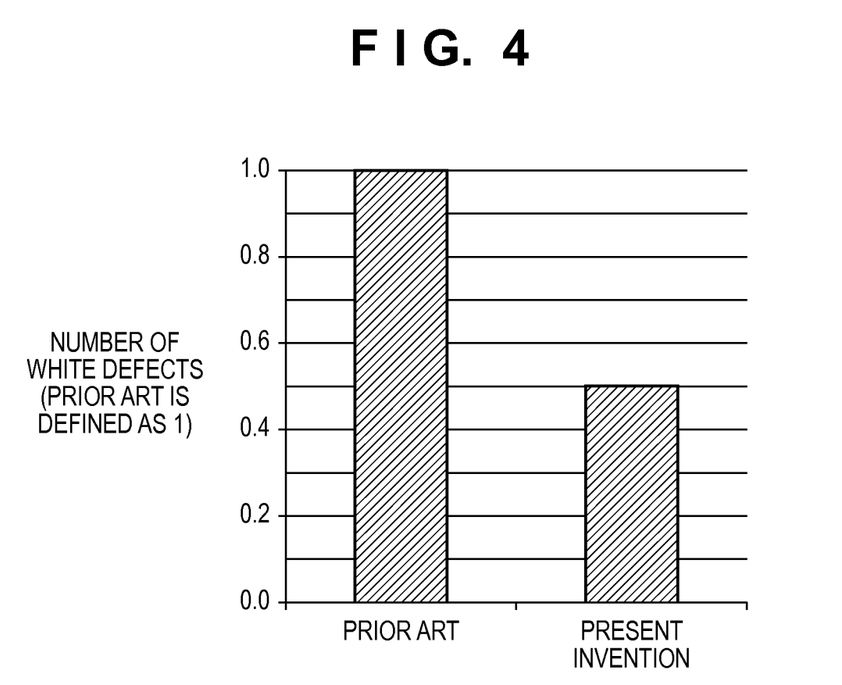
FIG. 4 is a drawing showing an example of white defect characteristics of the photoelectric conversion device to which the present invention is applied.

FIG. 3A is a schematic cross sectional view of the well contact region. FIG. 3B and FIG. 3C show impurity concentration distributions in a cut surface of a region where the contact plug is present obtained by cutting the region in a depth direction along line A-A'. In the case of FIG. 3B, a position where the concentration of the n-type impurity to be (currently) implanted is maximum is formed to be deeper than a position where the concentration of the p-type impurity introduced through an opening of a mask before the contact hole is formed is maximum. Consequently, such a p-type semiconductor region that has a net concentration of the p-type impurity smaller than that in the surroundings is formed in the well contact region 116, where the net concentration of the p-type impurity is obtained by taking away (subtracting) the concentration of the n-type impurity from the concentration of the p-type impurity. To the contrary, in the case of the present invention shown in FIG. 3C, it is configured that a position where the concentration of the n-type impurity to be (currently) implanted is maximum is equal to, or shallower than a position where the concentration of the p-type impurity previously implanted is maximum. Specifically, it is configured that in the well contact region 116, a distance between the contact plug and the position where the concentration of the n-type impurity is maximum is equal to or less than a distance between the contact plug and the position where the concentration of the p-type impurity is maximum. In the present invention, through this configuration, it is possible to form the p-type semiconductor region having a higher concentration than that in the surroundings in the well contact region 116. It is considered that in the well contact region 116, there are crystal defects induced by contact etching and a large amount of ion implantation. According to the present invention, it is possible to surround electrons generated from such crystal defects that are noise sources by the p-type semiconductor region having a high impurity concentration, thereby preventing electron diffusion from reaching a charge accumulation layer. Accordingly, it is possible to reducer noises, such as white defects and dark currents. FIG. 4 shows an example of white defect characteristics of a solid state imaging element to which the present invention is applied. It is appreciated that white defects are reduced by half by applying the impurity distribution structure of the present invention. Hence, it is appreciated that the impurity distribution structure according to the present invention attains reduction of the noise characteristics.

In the peripheral circuit section 102 in FIG. 2, there are formed a gate electrode 121 of a second conductivity type MOS transistor, a gate electrode 122 of a first conductivity type MOS transistor, and a second conductivity type semiconductor region 123 having a high impurity concentration, which is to be a source or a drain. A second conductivity type semiconductor region 124 having a low impurity concentration provides an LDD structure. The second conductivity type semiconductor region 124 has a lower impurity concentration than that of the semiconductor region 123. A first conductivity type semiconductor region 125 having a high impurity concentration is to be a source or a drain. A first conductivity type semiconductor region 126 having a low impurity concentration provides an LDD structure. The first conductivity type semiconductor region 126 has a lower impurity concentration than that of the semiconductor region 125. A side spacer 131b is provided on each side surface of the gate electrode 121 and the gate electrode 122. The side spacer 131b may be a laminated body formed of a silicon oxide layer and a silicon nitride layer. An electrode 134 in the peripheral circuit section 102 may be formed of metallic compounds, such as cobalt silicide, for example. An insulation film 135b that is a laminated film formed of a silicon oxide layer and a silicon nitride layer functions as an etching stopper film at the time of forming a contact plug. An electrical conductor 141b is a contact plug or the like.

If the antireflection film 131a of the pixel circuit section 101 and the side spacer 131b of the peripheral circuit section 102 are formed to have an identical layer structure using an identical film, it is possible to reduce manufacturing cost. The antireflection film 131a of the pixel circuit section 101 may be used as an etching stopper when a contact is opened by anisotropic dry etching. Through this configuration, even if the contact overrides the element isolation region due to alignment deviation, the contact is prevented from coming into contact with the element isolation region and the well 117 on the side surface. Hence, it is possible to prevent a leak current between the impurity regions 114, 115 having a low impurity concentration and the well 117. Accordingly, it is possible to decrease a distance between the contact and the element isolation region, thereby fining the element. A first conductivity type well 127 and a second conductivity type well 128 are formed in the peripheral circuit section 102 on the semiconductor substrate 100, as will be described with reference to FIGS. 5A to 5P. Further, there is formed an interlayer insulation film 133 of a silicate glass film.

A producing method of the photoelectric conversion device of the present embodiment will be described with reference to FIGS. 5A to 5P. For convenience of explanation, it is shown in FIGS. 5A to 5P that the pixel circuit section 101 and the peripheral circuit section 102 are adjacent to each other. In FIG. 5A, the element isolation region 103 formed through shallow trench isolation (STI) or local oxidation of Silicon (LOCOS) is formed on the semiconductor substrate 100 of silicon or the like. The element isolation region 103 isolates the active regions in the pixel circuit section 101 and the peripheral circuit section 102. A second conductivity type (n-type) well 128, and first conductivity type (p-type) well 117 and well 127, which are used for forming elements, are formed on the semiconductor substrate 100, respectively. In the pixel circuit section 101 for forming pixels, there is formed the second conductivity type (n-type) impurity region 113 as a storage area of the photoelectric conversion element. For the sake of forming the photoelectric conversion element into an embedding structure, the p-type impurity region 118 is formed on the surface of the photoelectric conversion element. In the pixel circuit section 101, there are formed the floating diffusion (FD) 114 and the second conductivity type (n-type) impurity region 115 having a low impurity concentration to be a single drain structure of the photoelectric conversion region. On the semiconductor substrate 100, there are formed the second conductivity type (n-type) gate electrodes 111, 112, 121, and the first conductivity type (p-type) gate electrode 122. Impurity is implanted in a region to be the LDD structure so that there are formed the second conductivity type (n-type) semiconductor region 124 having a low impurity concentration, and the first conductivity type (p-type) semiconductor region 126 having a low impurity concentration.

Figure 5B:
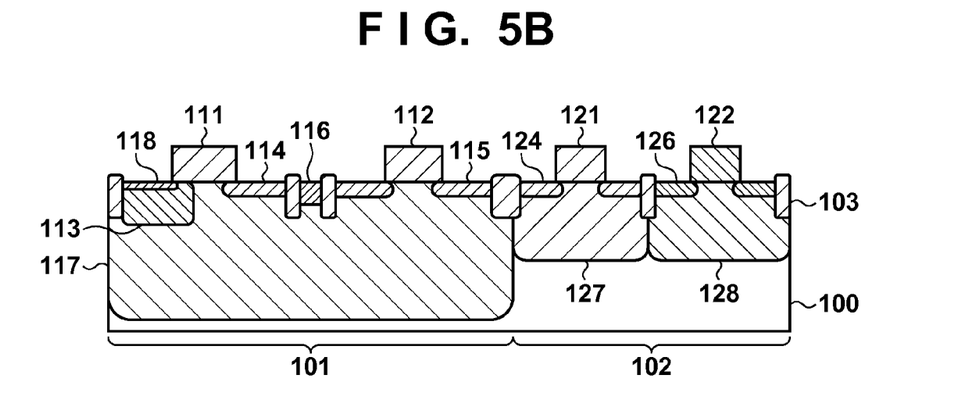
Figure 5C:
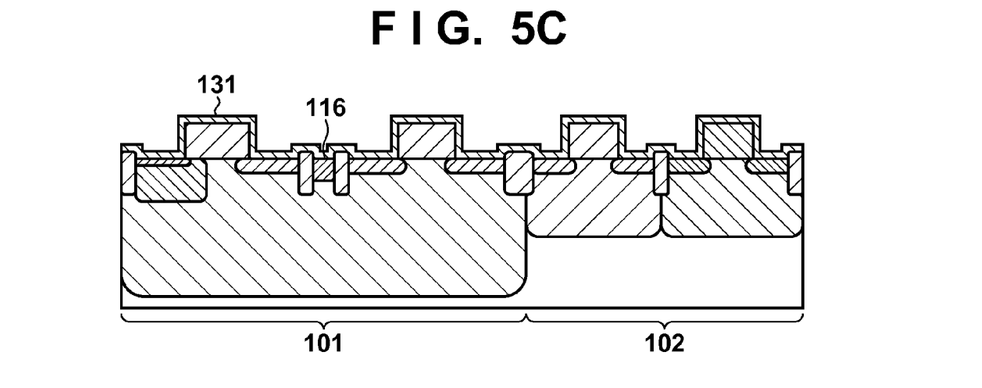

As shown in FIG. 5B, in order to form the well contact region 116 for specifying a potential for the well 117, the first conductivity type (p-type) impurity is ion-implanted through the opening of the mask. For example, implanted intensity may be set within a range of 10 to 50 KeV in the case of ion implantation using boron as the ion species. It can be done to set the implanted intensity within a range of 20 to 25 KeV. The region where the ion-plantation is carried out through the opening of the mask becomes greater than a diameter of a contact hole to be subsequently formed. As shown in FIG. 5C, there is formed a dielectric film 131. The dielectric film 131 may be a laminated film formed of a silicon oxide layer and a silicon nitride layer. The dielectric film 131 of this example includes a silicon nitride layer formed through the low pressure CVD.

Figure 5D:
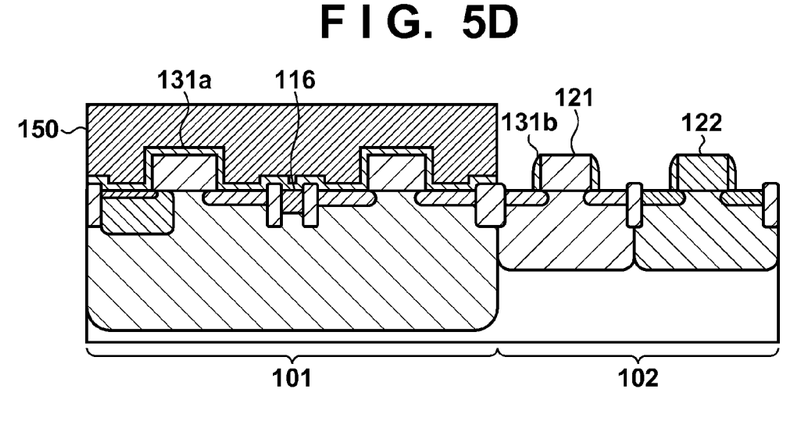
Figure 5E:
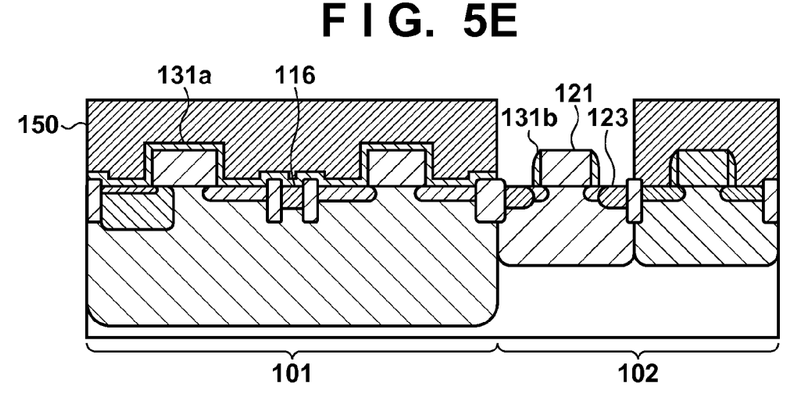
Figure 5F:
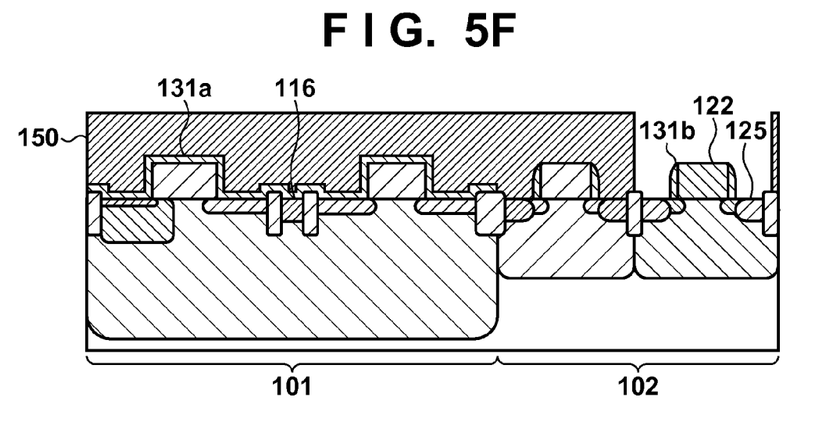
Figure 5G:
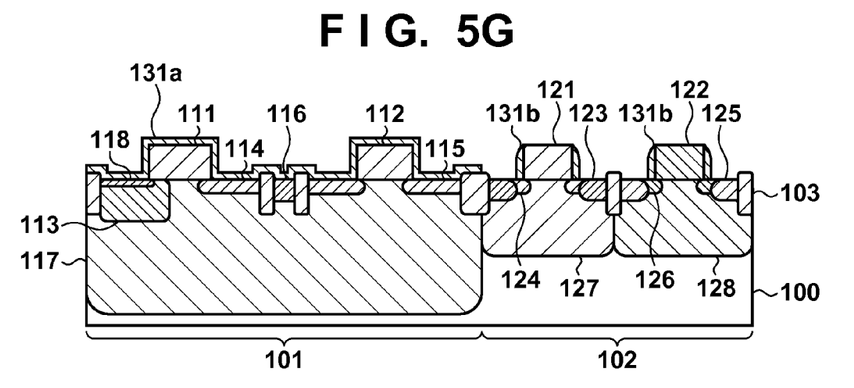

As shown in FIG. 5D, a resist 150 is formed on the pixel circuit section 101, and then the dielectric film 131 is etch-backed. In this manner, the side spacer 131b is formed from the dielectric film on the side walls of the gate electrodes 121, 122 of the peripheral circuit section 102. A portion of the dielectric film 131 that is covered with the resist 150 remains as the antireflection film 131a. If the dielectric film 131 is a laminated film formed of a silicon oxide layer and a silicon nitride layer, the antireflection film 131a and the side spacer 131b are formed into a lamination structure. As shown in FIG. 5E, the resist 150, and the gate electrode 121 and the side spacer 131b of the second conductivity type (n-type) MOS transistor of the peripheral circuit section 102 are used as masks for ion implantation so that the n-type impurity is introduced. In this manner, there is formed the high impurity concentration semiconductor region 123 having self-aligned source and drain on the side surface of the side spacer. Similarly, as shown in FIG. 5F, the resist 150, and the gate electrode 122 and the side spacer 131b of the first conductivity type (p-type) MOS transistor of the peripheral circuit section 102 are used as masks for ion-implantation so that the p-type impurity is introduced. In this manner, there is formed the high impurity concentration semiconductor region 125, thereby obtaining such a structure as shown in FIG. 5G.

Figure 5H:
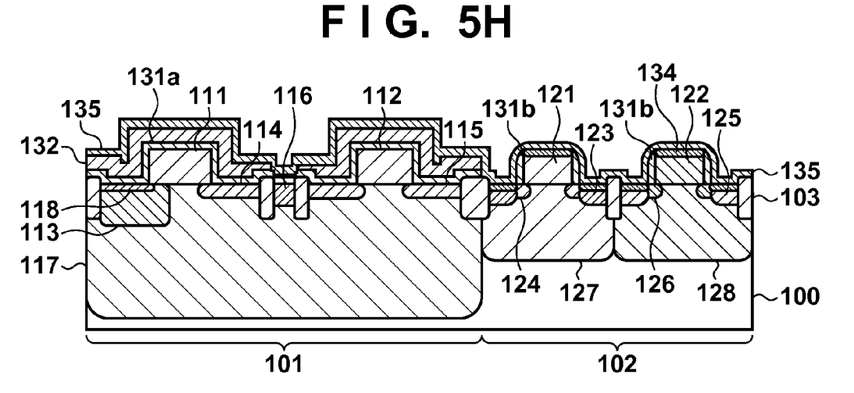
Figure 5I:
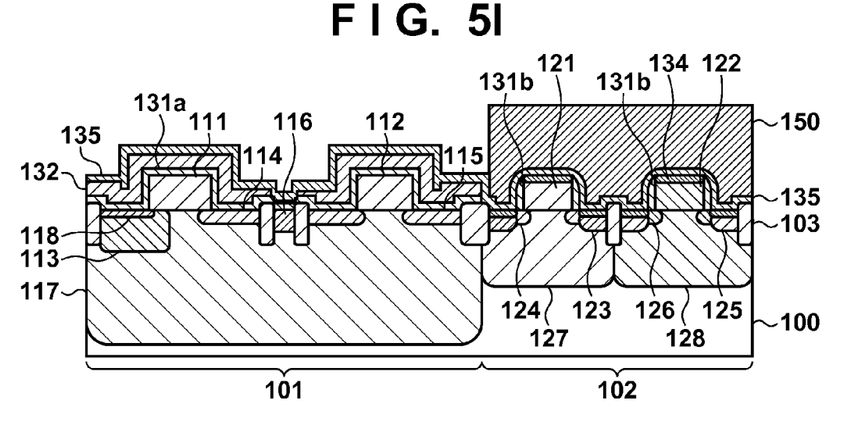
Figure 5J:
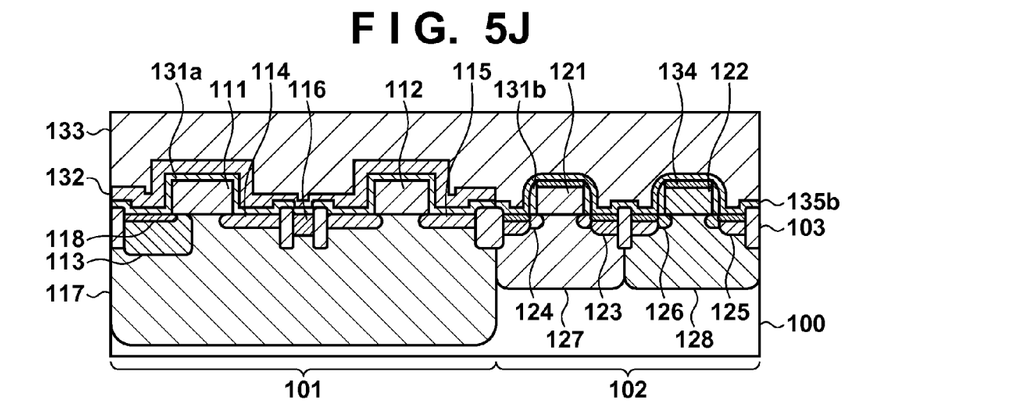
Figure 5K:
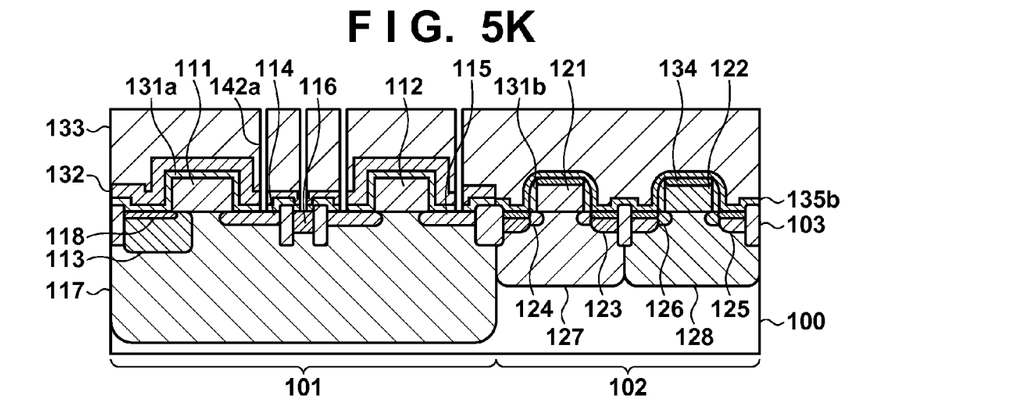

As shown in FIG. 5H, there are formed the protective film 132, and the electrode 134 of cobalt silicide or the like, and the insulation film 135 in the peripheral circuit section 102. The protective film 132 protects the pixel circuit section 101 from metal pollution, such as cobalt silicide. The insulation film 135 functions as an etching stopper at the time of forming the contact plug. The insulation film 135 may be a laminated film formed of a silicon oxide layer and a silicon nitride layer. As shown in FIG. 5I, the resist 150 is formed on the peripheral circuit section for the purpose of etching the insulation film 135. Subsequently, there is formed an interlayer insulation film 133 of a silicate glass film, such as BPSG, or a silicon oxide film. Accordingly, as shown in FIG. 5J, the insulation film 135b as the etching stopper can be left in the peripheral circuit.

As shown in FIG. 5K, the dielectric film functioning as the antireflection film 131a of the pixel circuit section 101 is used as an etching stopper so that the contact hole 142a is opened by the anisotropic dry etching (a first contact hole forming step). The contact hole 142a is formed in such a manner that a portion of the pixel circuit section 101 with which a bottom portion of the contact hole comes into contact is self-aligned onto the semiconductor substrate.

Figure 5L:
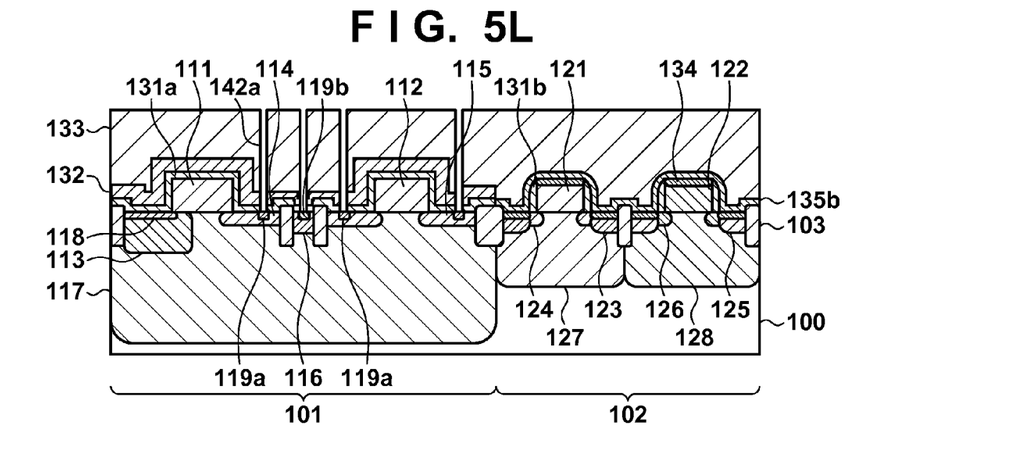

As shown in FIG. 5L, in order to supply a stable potential for the n-type impurity region 114 and the impurity region 115 of the second conductivity type, it is required in a portion coming into contact with the bottom portion of the contact plug to secure enough impurity concentration to provide electrical connection with metallic wiring. For this purpose, the n-type impurity is implanted in the contact hole of the pixel circuit section 101 after this contact hole is opened, so that the surface region 119a containing both the p-type impurity and the n-type impurity is formed. The n-type impurity is also implanted in the well contact region, so that the surface region 119b containing both the p-type impurity and the n-type impurity is formed. The concentration peak of the n-type impurity to be (currently) implanted should be formed at a shallower position than a position of the concentration peak of the p-type impurity previously introduced. In order to attain this, implanted intensity may be set to be 30 KeV or less in the case of the ion-implantation using phosphorus as the ion species, for example. Boron at 20 to 25 KeV as the p-type impurity is ion-implanted through the mask into the aforementioned well contact region 116, and subsequently phosphorus at 30 KeV or less as the n-type impurity mentioned here is contact-ion-implanted. Accordingly, the position of the concentration peak of the n-type impurity from the surface of the well contact is shallower than the position of the concentration peak of the p-type impurity at a rate of (1/1.5) or less.

Figure 5M:
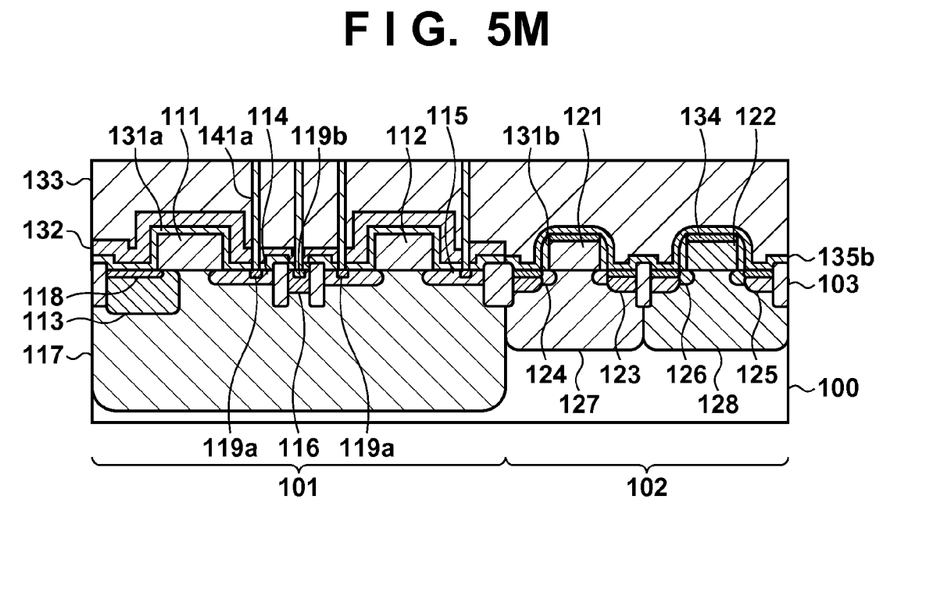
Figure 5N:
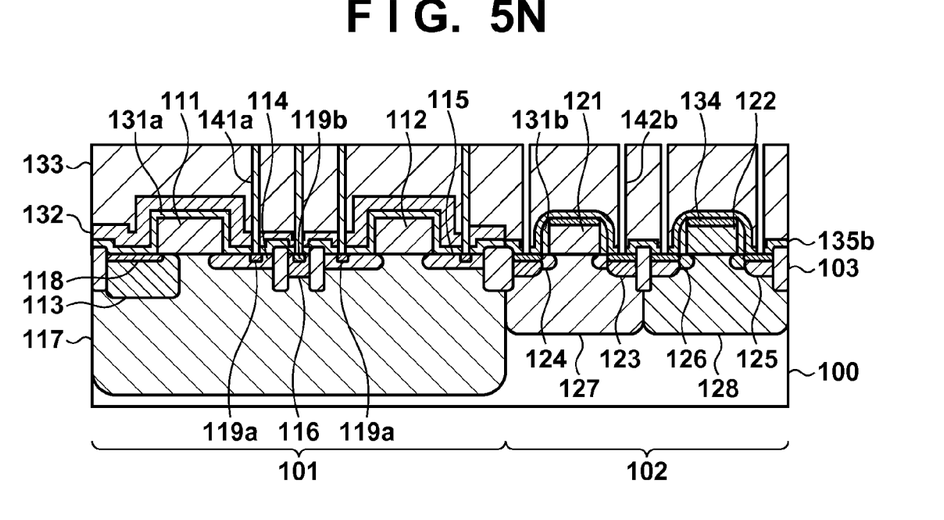
Figure 5O:
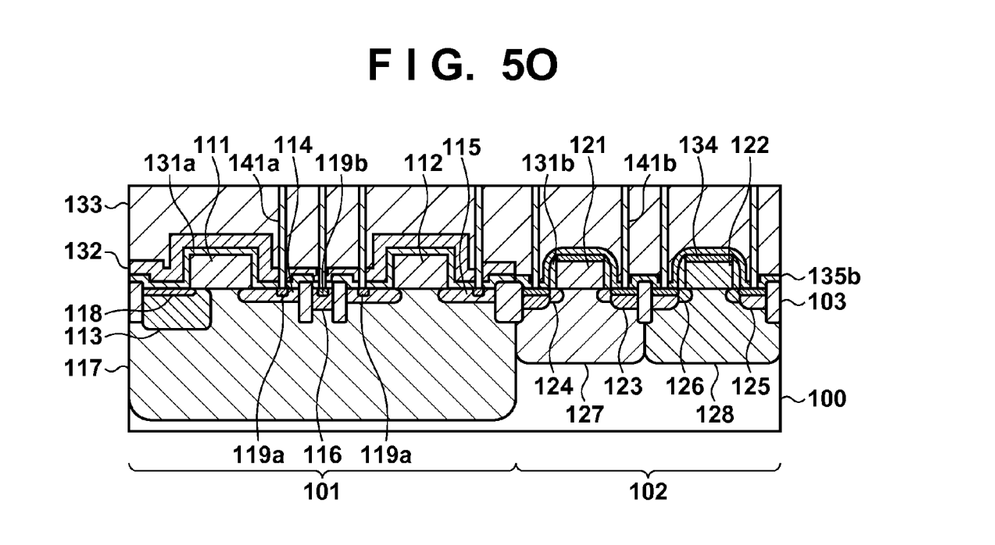
Figure 5P:
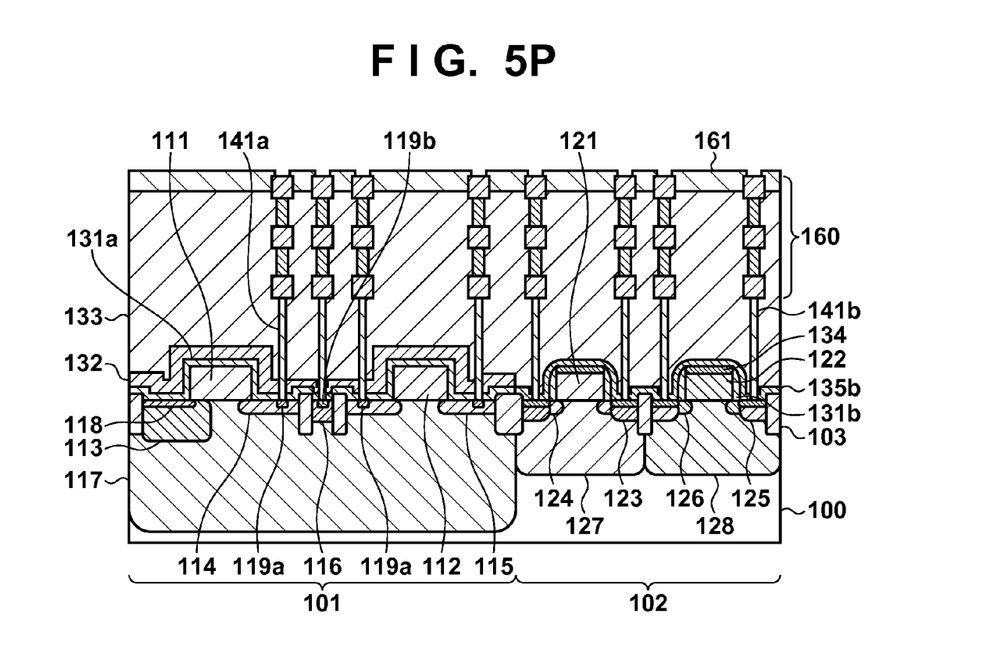

As shown in FIGS. 5M to 5O, the contact hole 142a of the pixel circuit section 101 is filled with an electrical conductor to form the electrode (contact plug) 141a. Thereafter, as shown in FIG. 5N, the insulation film 135b including the silicon nitride layer of the peripheral circuit section 102 is used as an etching stopper so that the contact hole 142b is opened through the anisotropic dry etching (second contact hole forming step). Specifically, the second contact hole forming step is carried out separately from the first contact hole forming step. Subsequently, both the contact holes 142a and 142b are filled with the electrical conductor to form electrodes. In this manner, a structure shown in FIG. 5O is obtained. Subsequently, a wiring layer 160 is formed using AL wiring, Cu wiring and the like, and thereafter, a passivation film 161 is formed through plasma CVD or the like, and then anneal treatment is carried out in a hydrogen atmosphere at approximately 350° or more, thereby obtaining a structure shown in FIG. 5P.

With the aforementioned producing method, it is possible to control the impurity profile of the first conductivity type impurity and the second conductivity type impurity that are introduced in the well contact region, respectively. Accordingly, it is possible to provide a solid-state imaging apparatus and a producing method thereof that are capable of realizing enhancement of the sensor characteristics, particularly reduction in noise deriving from white defects and dark current characteristics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-100785, filed May 14, 2014, which is hereby incorporated by reference herein in its entirety.

What is claimed is:

1. A method of manufacturing a photoelectric conversion, the method comprising:
   forming a pixel circuit section and a peripheral circuit section,
   wherein forming said pixel circuit section comprises:
      a step of forming a first semiconductor region for said pixel circuit section by implanting boron into a semiconductor substrate;
      a step of forming a second semiconductor region for said pixel circuit section in said first semiconductor region by further implanting boron into said first semiconductor region, said second semiconductor region having at least a p-type portion;

a step of forming an interlayer insulation film on said semiconductor substrate, said interlayer insulation film having a contact hole on said second semiconductor region;

a step of forming a third semiconductor region for said pixel circuit section in said second semiconductor region by implanting phosphorus from said contact hole into said p-type portion of said second semiconductor region; and a step of forming a contact plug for said pixel circuit section on said third semiconductor region by filling said contact hole with an electrical conductor, wherein boron is implanted at an implanted intensity of 10 to 50 KeV in the step of forming said second semiconductor region, and wherein phosphorus is implanted at an implanted intensity of 30 KeV or less in the step of forming said third semiconductor region.

2. The method according to claim 1, wherein no boron is implanted in said second semiconductor region after said contact hole is formed.

3. The method according to claim 1, the method further comprising:
a first contact hole forming step of forming said contact hole in said pixel circuit section; and
a second contact hole forming step of forming a contact hole in said peripheral circuit section,
wherein the first contact hole forming step is performed separately from the second contact hole forming step.

4. The method according to claim 3, wherein the second contact hole forming step is performed after the step of forming said third semiconductor region.

5. The method according to claim 1, the method further comprising:
a step of forming a drain of a MOS transistor for the pixel circuit section by implanting n-type impurity, not into a first part of said first semiconductor region, but into a second part of said first semiconductor region,
wherein, in said step of forming said second semiconductor region, the p-type impurity is implanted, not into the second part of said first semiconductor region, but into the first part of said first semiconductor region.

6. The method according to claim 1, the method further comprising a step of forming a drain of a MOS transistor for said pixel circuit section by implanting n-type impurity into said first semiconductor region, before the step of forming said second semiconductor region.

7. The method according to claim 1, the method further comprising a step of forming a gate electrode of a MOS transistor for said pixel circuit section, before the step of forming said second semiconductor region.

8. The method according to claim 1, the method further comprising a step of forming a side spacer of a MOS transistor for said peripheral circuit section, after the step of forming said second semiconductor region.

9. The method according to claim 1, the method further comprising a step of forming a dielectric film on said semiconductor substrate to cover the second semiconductor region, wherein said dielectric film is used as an etching stopper in forming said contact hole.

10. The method according to claim 1, the method further comprising:
a step of forming a drain of a MOS transistor for said pixel circuit section by implanting n-type impurity into said first semiconductor region,
wherein said interlayer insulation film has another contact hole on said drain, and phosphorus is implanted into said drain from the another contact hole, in the step of forming said third semiconductor region.

11. The method according to claim 1, wherein no n-type impurity is implanted in said second semiconductor region between the step of forming said second semiconductor region and the step of forming said third semiconductor region.

12. A method of manufacturing a photoelectric conversion, the method comprising:
forming a pixel circuit section and a peripheral circuit section,
wherein forming said pixel circuit section comprises:
a step of forming a first semiconductor region for said pixel circuit section by implanting p-type impurity into a semiconductor substrate;
a step of forming a second semiconductor region for said pixel circuit section in said first semiconductor region by further implanting said p-type impurity into said first semiconductor region, said second semiconductor region having at least a p-type portion;
a step of forming an interlayer insulation film on said semiconductor substrate, said interlayer insulation film having a contact hole on said second semiconductor region;
a step of forming a third semiconductor region for said pixel circuit section in said second semiconductor region by implanting n-type impurity from said contact hole into said second semiconductor region; and
a step of forming a contact plug for said pixel circuit section on said third semiconductor region by filling said contact hole with an electrical conductor,
wherein said p-type impurity is implanted in the step of forming said first semiconductor region and in the step of forming said second semiconductor region and said n-type impurity is implanted in the step of forming said third semiconductor region, in such a manner that a position where a concentration of said n-type impurity is at a maximum is closer to said contact plug than a position where a concentration of said p-type impurity is at a maximum, or equal to the position where the concentration of said p-type impurity is at the maximum.

13. The method according to claim 12, wherein no p-type impurity is implanted in said second semiconductor region after said contact hole is formed.

14. The method according to claim 12, wherein said p-type impurity is boron, and said n-type impurity is phosphorus.

15. The method according to claim 12, the method further comprising:
a step of forming a drain of a MOS transistor for the pixel circuit section by implanting n-type impurity not into a first part of said first semiconductor region but into a second part of said first semiconductor region,
wherein, in said step of forming said second semiconductor region, said p-type impurity is implanted not into the second part of said first semiconductor region but into the first part said first semiconductor region.

16. The method according to claim 12, the method further comprising a step of forming a drain of a MOS transistor for said pixel circuit section by implanting n-type impurity into said first semiconductor region, before the step of forming said second semiconductor region.

17. The method according to claim 12, the method further comprising a step of forming a gate electrode of a MOS transistor for said pixel circuit section, before the step of forming said second semiconductor region.

18. The method according to claim 12, the method further comprising a step of forming a side spacer of a MOS transistor for said peripheral circuit section, after the step of forming said second semiconductor region.

19. The method according to claim 12, the method further comprising:
   a step of forming a dielectric film on the semiconductor substrate to cover said second semiconductor region,
   wherein said dielectric film is used as an etching stopper in forming said contact hole.

20. The method according to claim 12, the method further comprising:
   a step of forming a drain of a MOS transistor for the pixel circuit section by implanting n-type impurity into said first semiconductor region,
   wherein said interlayer insulation film has another contact hole on said drain, and phosphorus is implanted into said drain from the another contact hole, in the step of forming said third semiconductor region.

\* \* \* \* \*